US012799590B2

(12) United States Patent
Pan

(10) Patent No.: US 12,799,590 B2
(45) Date of Patent: Nov. 17, 2026

(54) VAPOR DELIVERY SYSTEM USING IN-SITU PRESSURE SENSOR FOR SEMICONDUCTOR PROCESS SYSTEM

(71) Applicant: Yang Pan, Singapore (SG)

(72) Inventor: Yang Pan, Singapore (SG)

(73) Assignee: Inspiring Atoms Pte Ltd, Singapore (SG)

( * ) Notice: Subject to any disclaimer, the term of this patent is extended or adjusted under 35 U.S.C. 154(b) by 261 days.

(21) Appl. No.: 18/892,477

(22) Filed: Sep. 22, 2024

(65) Prior Publication Data

US 2026/0085410 A1 Mar. 26, 2026

(51) Int. Cl.
*C23C 16/448* (2006.01)
*C23C 16/48* (2006.01)

(52) U.S. Cl.
CPC ........ *C23C 16/4481* (2013.01); *C23C 16/482* (2013.01)

(58) Field of Classification Search
CPC .............. C23C 16/4481; C23C 16/448; C23C 16/44561; C23C 16/52
See application file for complete search history.

(56) References Cited

U.S. PATENT DOCUMENTS 5,835,678 A 11/1998 Li et al.
6,210,485 B1 4/2001 Zhao et al.
6,264,064 B1 * 7/2001 Birtcher .................... B01J 4/02 222/61
6,572,706 B1 6/2003 Nguyen et al.
7,437,060 B2 10/2008 Wang et al.
7,597,758 B2 10/2009 Chen et al.
7,967,911 B2 6/2011 Carlson et al.
9,238,865 B2 1/2016 Pomarede et al.
2008/0085226 A1 * 4/2008 Fondurulia ......... C23C 16/4481 422/198
2009/0214779 A1 * 8/2009 Sarigiannis ......... C23C 16/4481 118/725
2016/0052651 A1 * 2/2016 Nguyen .................... B65B 1/08 141/69
2022/0406625 A1 12/2022 Susa

FOREIGN PATENT DOCUMENTS

TW 1638063 B 10/2018
TW 1671833 B 9/2019

* cited by examiner

*Primary Examiner* — Joseph A Miller, Jr.

(57) ABSTRACT

Disclosed is a vapor delivery system for semiconductor fabrication, which integrates an in-situ pressure sensor to improve the precision of precursor delivery. The system addresses the challenge of maintaining consistent precursor delivery to the process chamber. It includes an ampoule containing a liquid precursor, equipped with an internal pressure sensor to monitor surface levels of the liquid precursor. The system further incorporates a heater to facilitate the conversion of the precursor into vapor, with various embodiments utilizing either resistive or optical heating elements.

18 Claims, 6 Drawing Sheets

VAPOR DELIVERY SYSTEM USING IN-SITU PRESSURE SENSOR FOR SEMICONDUCTOR PROCESS SYSTEM

FIELD OF THE INVENTION

This invention pertains to the domain of semiconductor device fabrication, specifically to the delivery systems employed for introducing precursors during various semiconductor processes. The focus is on an enhanced delivery mechanism using an in-situ pressure sensor to ensure precise control over the amount of liquid precursor introduced to a process chamber.

BACKGROUND

Semiconductor device fabrication involves multiple steps of processing involving introducing materials into a process chamber. Various precursors are employed to perform reactions in a process chamber. These precursors can be gaseous, liquid, or solid. There's a pressing need for a precursor delivery system capable of precisely controlling the amount of precursor introduced to the process chamber.

SUMMARY

This summary offers a brief overview of concepts, elaborated upon in the Detailed Description. It does not pinpoint the key or essential features of the subject in claim. Moreover, the scope of the claimed subject is not restricted to solutions addressing any highlighted drawbacks in this disclosure.

Certain embodiments encompass a semiconductor process system composed of a process chamber and a liquid precursor delivery system. This chamber processes a substrate situated on a pedestal and incorporates a liquid precursor delivery apparatus, such as a showerhead. Precise control of the liquid precursor amount entering the process chamber is pivotal. Typically, a vapor delivery system employing a carrier gas transports the vaporized liquid precursor to the process chamber. The semiconductor industry has faced persistent challenges ensuring accurate control over the quantity of liquid precursor introduced during individual process steps. Such inconsistencies can lead to issues like variations in deposited or etched film thickness.

In other embodiments, the liquid precursor resides in an ampoule. Positioned on the ampoule's inner sidewall, a liquid pressure sensor detects changes. A heater facilitates the transformation of the liquid precursor into vapor.

Further, the liquid precursor reaches a level where the pressure, as gauged by the sensor, matches a predefined initial setting. A carrier gas, such as argon, enters the ampoule, ushering the precursor vapor towards the process chamber. This pressure, tracked by the sensor, is consistently monitored until it aligns with a secondary setting. Subsequently, a valve halts precursor delivery to the chamber, signaling the end of that particular process step. Once this step concludes, a bulk fill device replenishes the ampoule with liquid precursor until the sensor reads the initial setting, prepping it for the next substrate processing.

In some implementations, the utilized heater is resistive, and the ampoule comprises metal, potentially stainless steel.

Additionally, some implementations use an optical heater, emitting light to heat up the liquid precursor's surface. This optical heater might take the form of a light-emitting diode array, or a lamp positioned over the precursor surface.

In other variations, the optical heater specifically projects ultraviolet light, targeting only the liquid precursor's surface.

BRIEF DESCRIPTION OF THE DRAWINGS

For a more profound understanding, reference the detailed description in tandem with the provided illustrations.

DETAILED DESCRIPTION

The ensuing detailed elucidation of the present invention presents specific implementations to offer a comprehensive understanding of the invention. However, it will be evident to those proficient in the art that the present invention can be practiced without these specific details, or by employing alternative elements or procedures. In other instances, well-recognized processes, procedures, and components are not detailed extensively to avoid unnecessarily obscuring aspects of the present invention.

Figure 1:
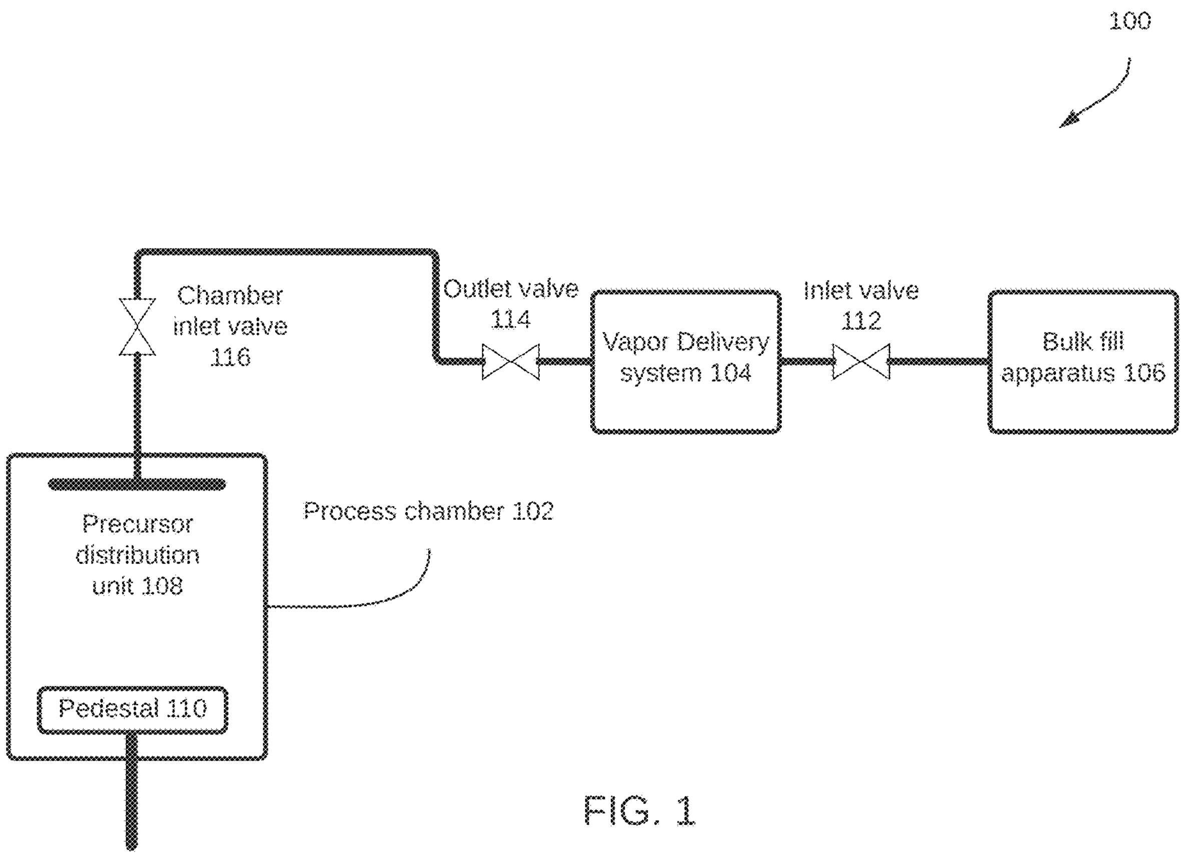
FIG. 1 displays an embodiment of a semiconductor process system, highlighting the process chamber and liquid precursor delivery mechanism.

An exemplary semiconductor process system is depicted in FIG. 1. This system 100 encompasses a process chamber 102 connected to a vapor delivery system 104. The chamber 102 receives a vaporized liquid precursor conveyed by a carrier gas, typically an inert gas such as argon. The vapor delivery system 104 is further linked to a bulk fill apparatus 106 via an inlet valve 112. This bulk fill apparatus 106 can replenish the liquid precursor up to a set level post-processing each substrate. This methodology ensures a consistent ampoule condition for every substrate, thus mitigating issues like varied headspaces that could influence the consistency of liquid precursor delivery.

The process chamber 102 also integrates a precursor distribution unit 108, which could either be a showerhead or an injector. This unit might have to accommodate multiple precursors and gases depending on the requirements of the process in the chamber 102. To support the substrate being processed, the chamber incorporates a pedestal 110. Depending on the specific implementation, this pedestal could be an electrostatic chuck or a vacuum chuck.

Depending on the application, the chamber 102 can be specialized. For instance, it can be a thermal Chemical Vapor Deposition (CVD) system, a Plasma Enhanced Chemical Vapor Deposition (PECVD) system, a thermal Atomic Layer Deposition (ALD) system, a Plasma Enhanced Atomic Layer Deposition (PEALD) system, a Reactive Ion Etching (RIE) system, or an Atomic Layer Etching (ALE) system.

Figure 2A:
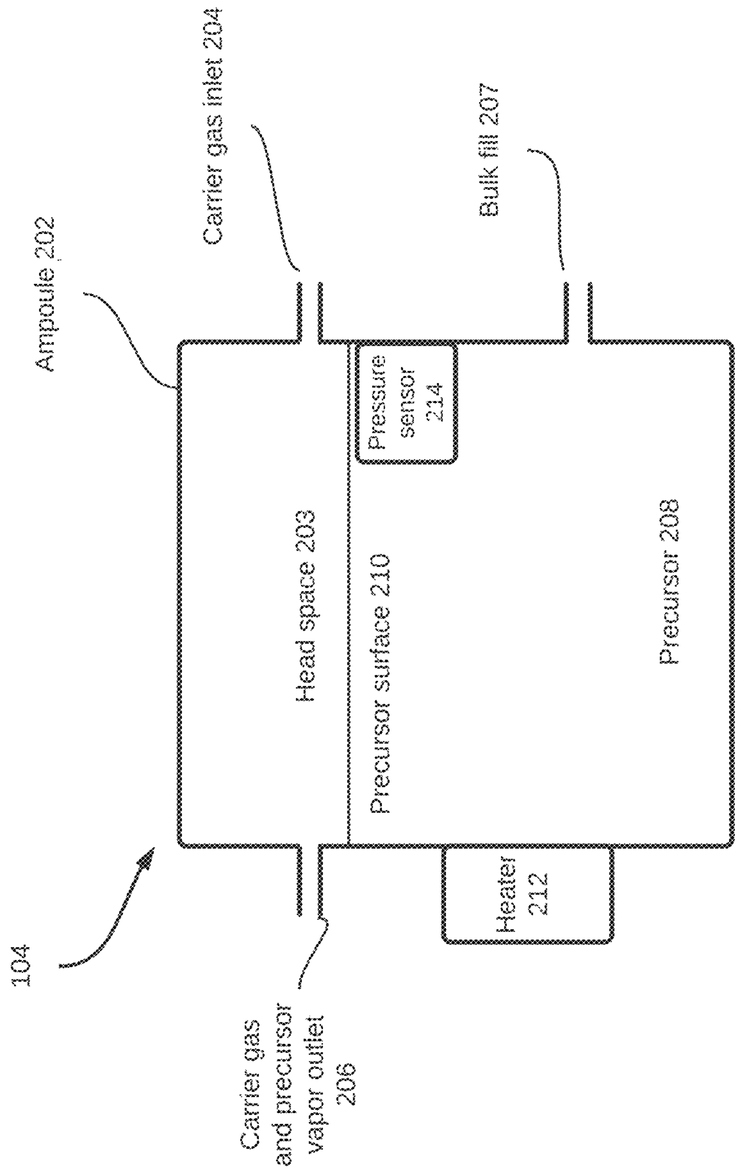
FIG. 2A depicts a vapor delivery system model with a liquid pressure sensor embedded within the precursor, complemented by a resistive heater.

Elaborating on the vapor delivery system 104, as shown in FIG. 2A, it incorporates an ampoule 202 designated to store the liquid precursor destined for the process chamber 102. The material constituting this ampoule could vary, with options including stainless steel, aluminum, quartz, plastic, or ceramics.

This vapor delivery system 104 connects to a gasbox via a carrier gas inlet 204, facilitating the introduction of carrier gas which can be regulated with a valve (not explicitly illustrated in FIG. 2A). Additionally, there's an outlet 206, enabling the mixed carrier gas and the vaporized liquid precursor to move towards the chamber 102. Another inlet 207 links the vapor delivery system 104 and the bulk fill apparatus 106, allowing the liquid precursor 208 to fill the ampoule 202 up to a designated precursor surface 210. The headspace 203 over this liquid precursor surface 210 provides a path for the carrier gas, aiding in transporting the vaporized liquid precursor to the chamber 102.

To ensure effective vaporization, the liquid precursor 208 in the ampoule 202 can be heated to a designated temperature using a heater 212, which, in this embodiment, is a resistive heater. An associated temperature sensor (not depicted in FIG. 2A) can monitor the temperature of this liquid precursor 208, maintaining it at a consistent level. It's crucial that the precursor's surface temperature attains its boiling point to promote effective vaporization.

A unique aspect of this system is the incorporation of a pressure sensor 216 placed along the ampoule 202's sidewall. The vertical positioning of this sensor is pivotal. Prior to commencing a process step, the ampoule 202 is filled with the liquid precursor 208 such that its surface level is above the pressure sensor 214. By gauging the pressure difference from the start to the end of a process step, the change in the precursor's surface level, and thereby its consumption, can be discerned. Calibration of this pressure sensor 216 is essential for accurately determining the consumption of the liquid precursor.

For precise measurements, various types of pressure sensors, such as piezoresistive, capacitive, or optical, can be employed. A capacitive pressure sensor, given its high sensitivity, is particularly apt for detecting minor pressure variations in liquids.

Figure 2B:
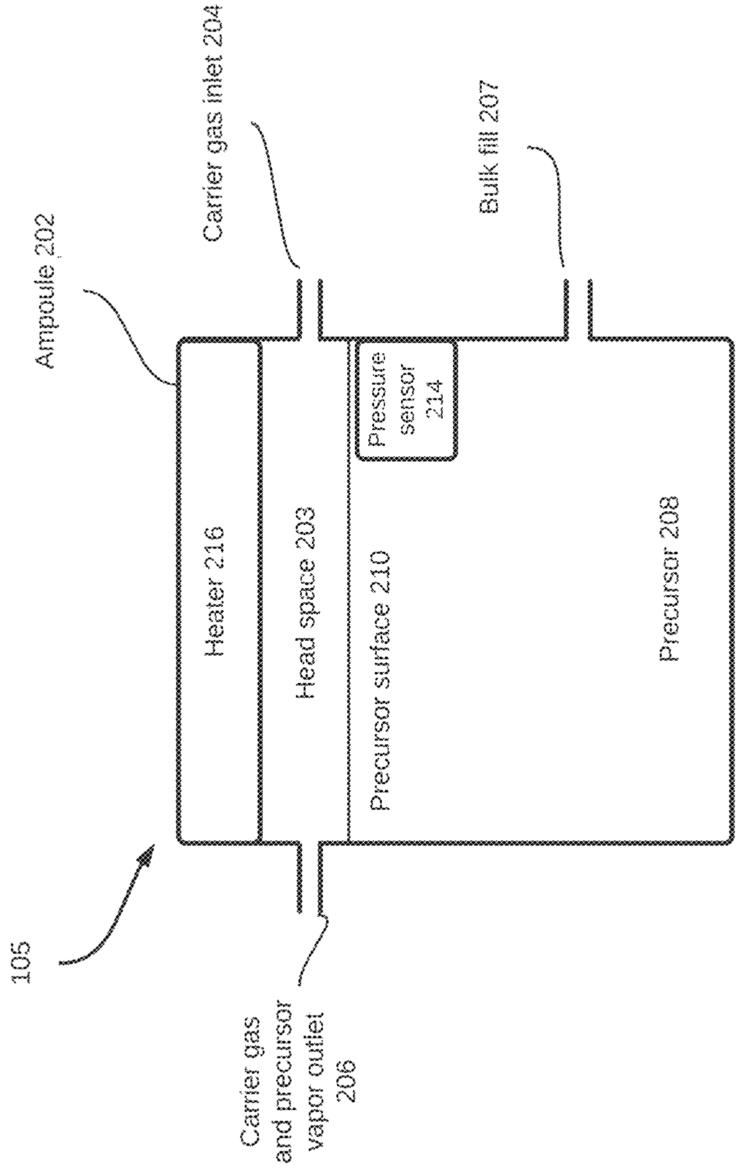
FIG. 2B outlines another vapor delivery system, this time with the liquid pressure sensor in the precursor and an optical heater above.

An alternative vapor delivery system 105 design is outlined in FIG. 2B. Here, an optical heater 216 supersedes the resistive heater 212 seen in FIG. 2A. Positioned above the precursor surface 210, the optical heater 216's distance from this surface 210 typically ranges between 0.1 to 10 cm. This heater, drawing power from a supply (not illustrated in FIG. 2A), can either be a light emitting diode (LED) heater array or a lamp emitting light. The inherent principle leverages light absorption by liquid molecules, with the absorbed energy fostering molecular vibration, elevating the temperature. Once this temperature reaches the boiling point, vaporization ensues. The efficacy of this mechanism is influenced by the wavelength of the emitted light and the properties of the liquid. If ultraviolet light is emitted from the LED or the lamp, the absorption will be concentrated on the surface of the liquid.

Figure 3:
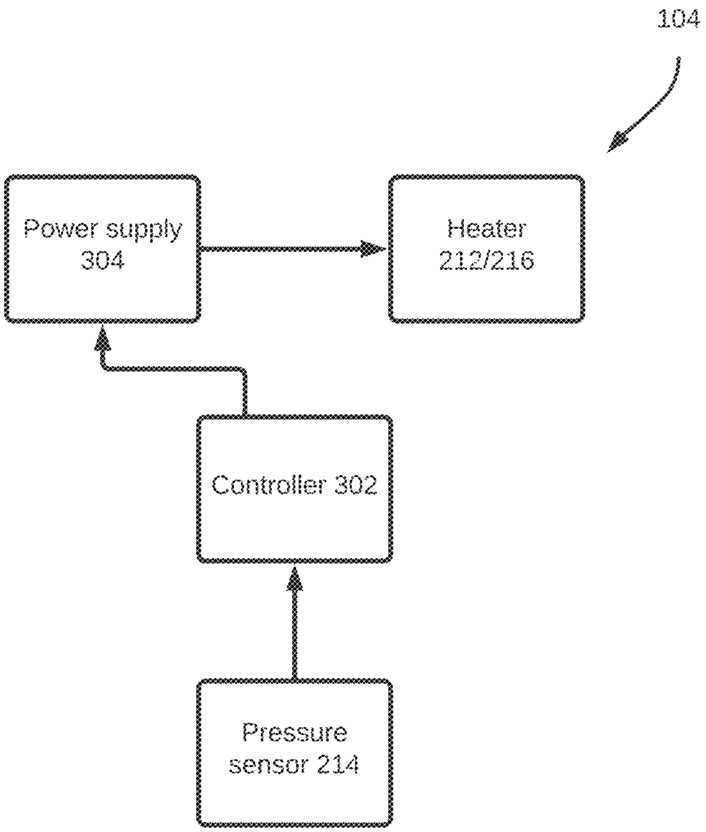
FIG. 3 offers a functional representation of a typical vapor delivery system.

FIG. 3 presents a functional diagram of the vapor delivery system 104. System 104 incorporates a controller, labeled 302. In a specific configuration, this controller 302 serves as a computer. In another implementation, the controller 302 is a component of a system controller for process system 100. System 104 also features a power supply, identified as 304, responsible for energizing either heater 212 or heater 216. The controller 302 processes data from pressure sensor 214 and determines the precise timing for initiating or concluding a process step.

Figure 4:
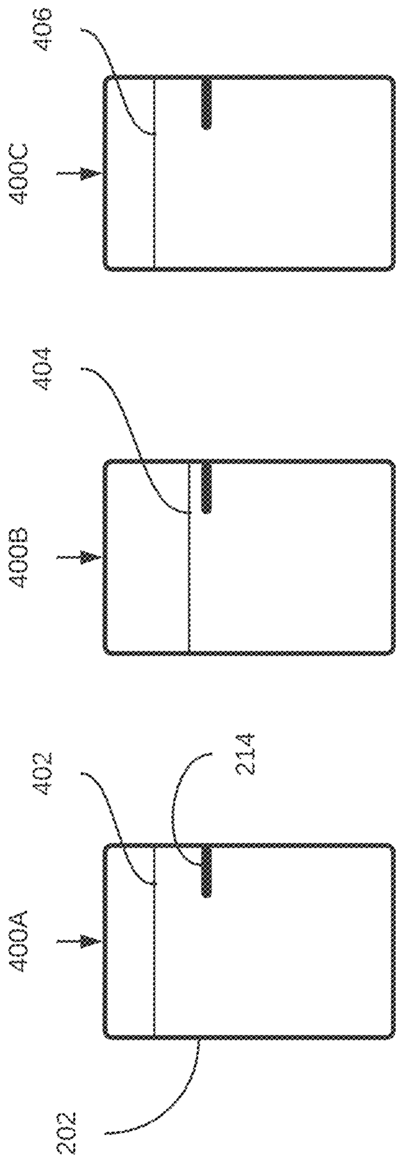
FIG. 4 schematically details the liquid precursor delivery system's operation.

FIG. 4 schematically outlines the operational principles of process system 100:

In depiction 400A, the ampoule is in a state ready to transfer the liquid precursor into chamber 102, marking the beginning of a step of the substrate processing. Surface level 402 is aligned with the initial setting value recorded by pressure sensor 214.

Depiction 400B represents a state post the delivery of the necessary precursor amount for the step, indicating that this step is nearing its conclusion. Surface level 404 corresponds to the secondary setting value, as gauged by pressure sensor 214.

Depiction 400C illustrates a situation where ampoule 202 has been refilled to surface level 406.

Figure 5:
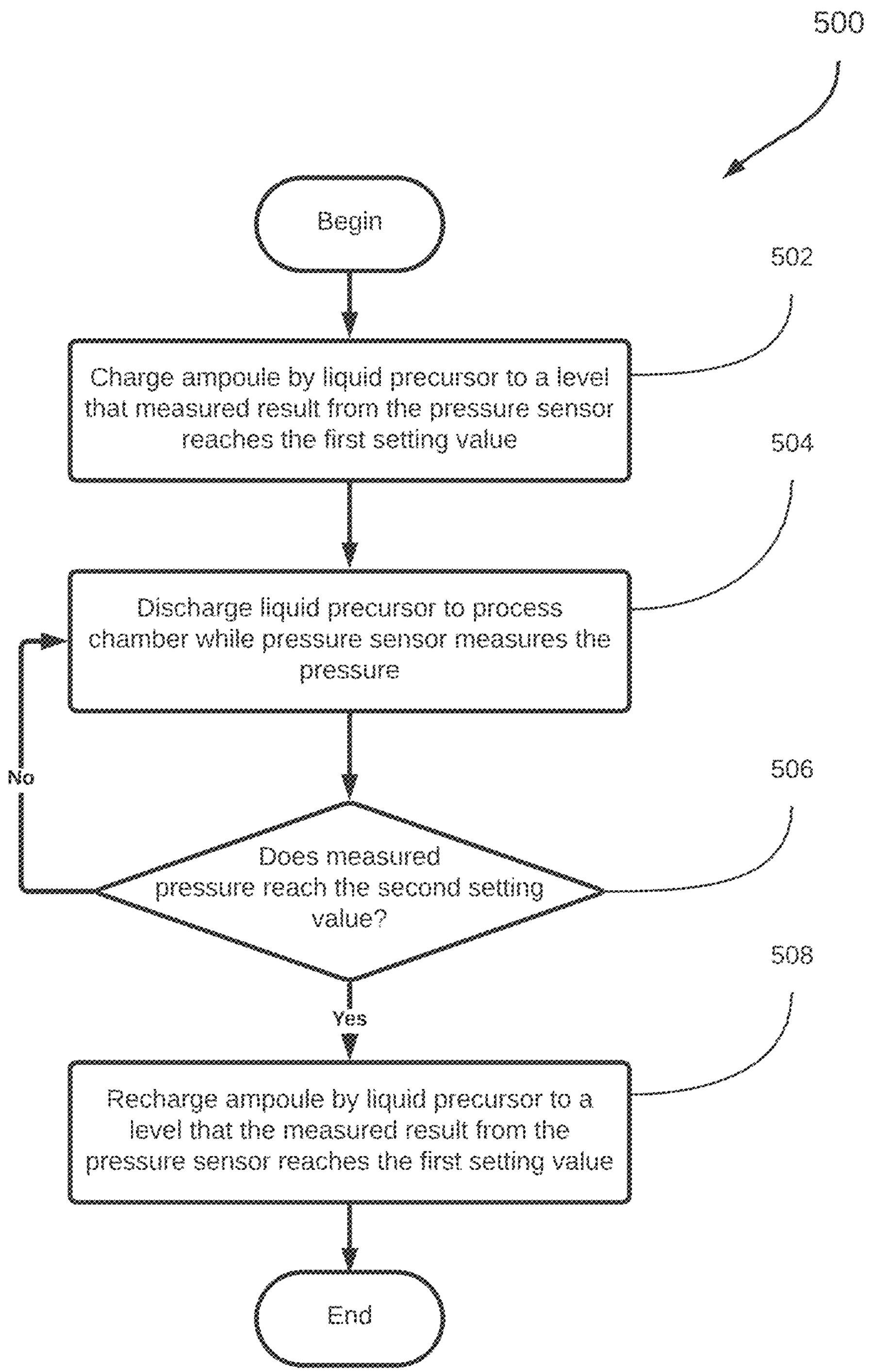
FIG. 5 presents a flowchart capturing the workings of a vapor delivery system governed by a liquid pressure sensor and a controller.

FIG. 5 provides a flowchart that describes process 500 for the process system 100, utilizing pressure sensor 214 under the guidance of controller 302. The sequence is as follows:

In step 502, ampoule 202 is charged to a surface level, prepared for processing a substrate in chamber 102. This level is ascertained when pressure sensor 214's reading matches the first setting value. This initial setting is often determined during process recipe formulation, with a crucial calibration between pressure sensor 214's output and the surface level.

During step 504, the liquid precursor is channeled into chamber 102, initiating substrate processing. Here, pressure sensor 214 is actively tracking the depleting liquid precursor level within ampoule 202. At regular intervals, data from pressure sensor 214 is contrasted against a second setting value. This checking frequency can vary from 10 to 1000 times during the step. For example, if a process step has a duration of 100 seconds, evaluations and subsequent comparisons might occur between 0.1 to 10-second intervals, contingent on the process's sensitivity parameters.

In step 506, when the reading from pressure sensor 214 matches the second setting value, the process step terminates. If this reading isn't achieved, the sequence returns to step 504 and continues in this loop until the required value is reached. This entire procedure, from steps 502 to 506, can be replicated for different substrates.

The invention claimed is:

1. A vapor delivery system, comprising:

an ampoule containing a liquid precursor, equipped with a first inlet for intake of carrier gas and an outlet to dispatch the carrier gas and vaporized precursor to a process chamber;

a second inlet coupled to a bulk fill apparatus for replenishing the ampoule with liquid precursor;

a heater dedicated to heating up the liquid precursor;

a liquid pressure sensor submerged at a fixed vertical position in the liquid precursor and configured to measure a pressure of the liquid precursor corresponding to a surface level of the liquid precursor in the ampoule during a process step in the process chamber; and a controller configured to start a process step when measured pressure reaches a first setting value corresponding to a first surface level of the liquid precursor and to end the step when measured pressure reaches a second setting value corresponding to a second surface level of the liquid precursor lower than the first surface level, wherein the controller coordinates the bulk fill apparatus to charge the ampoule after the second setting value is reached until the measured pressure by the pressure sensor reaches the first setting value.

2. The vapor delivery system of claim 1, wherein the liquid pressure sensor is positioned on the ampoule's sidewall.

3. The vapor delivery system of claim 1, wherein the heater integrates a resistive heating element.

4. The vapor delivery system of claim 1, wherein the heater utilizes an optical heating mechanism.

5. The vapor delivery system of claim 4, further comprising a light-emitting diode array positioned above the liquid precursor's surface.

6. The vapor delivery system of claim 5, wherein the array emits ultraviolet light.

7. The vapor delivery system of claim 4, further comprising a lamp situated above the precursor surface.

8. The vapor delivery system of claim 7, wherein the lamp emits ultraviolet light.

9. A method for transferring a specified quantity of liquid precursor from an ampoule to a process chamber, comprising:

filling the ampoule with liquid precursor until a liquid pressure sensor submerged at a fixed vertical position within the liquid precursor measures a pressure of the liquid precursor reaching a first predetermined value corresponding to a first surface level of the liquid precursor, and commencing the process step in response to the measured pressure reaching the first predetermined value; and delivering the liquid precursor from the ampoule into the chamber until the sensor measures a pressure reaching a second predetermined value corresponding to a second surface level of the liquid precursor lower than the first surface level, and ending the process step in response to the measured pressure reaching the second predetermined value.

10. The method of claim 9, wherein the liquid pressure sensor is affixed at a pre-defined spot on the ampoule's sidewall.

11. A process system, comprising:

a process chamber that houses a precursor distribution unit and a pedestal for substrate placement;

a vapor delivery system; and an apparatus for adjusting the liquid precursor's level in an ampoule, the apparatus comprising a liquid pressure sensor submerged at a fixed vertical position in the liquid precursor and a controller coupled to the liquid pressure sensor, wherein the controller is configured to determine a starting surface level for a process step based on a first measured liquid pressure and a finishing surface level lower than the starting surface level based on a second measured liquid pressure.

12. The process system of claim 11, wherein the process chamber functions as a thermal process chamber.

13. The process system of claim 11, wherein the process chamber operates as a plasma-enhanced deposition chamber.

14. The semiconductor process system of claim 11, wherein the process chamber is designed for etching.

15. The semiconductor process system of claim 11, wherein the vapor delivery system is interfaced with a bulk fill apparatus for liquid precursor.

16. The semiconductor process system of claim 11, further integrating a resistive heater to heat up the liquid precursor.

17. The semiconductor process system of claim 11, also incorporating a light-emitting diode array positioned atop the liquid precursor in the ampoule.

18. The semiconductor process system of claim 11, wherein said pressure sensor is a capacitive sensor.

* * * * *